US008920560B2

(12) United States Patent
Koike et al.

(10) Patent No.: US 8,920,560 B2
(45) Date of Patent: Dec. 30, 2014

(54) METHOD FOR MANUFACTURING EPITAXIAL WAFER

(75) Inventors: Yasuo Koike, Tokyo (JP); Toshiaki Ono, Tokyo (JP); Naoki Ikeda, Tokyo (JP); Tomokazu Katano, Tokyo (JP)

(73) Assignee: Sumco Corporation, Tokyo (JP)

( * ) Notice: Subject to any disclaimer, the term of this patent is extended or adjusted under 35 U.S.C. 154(b) by 1847 days.

(21) Appl. No.: 11/934,461

(22) Filed: Nov. 2, 2007

(65) Prior Publication Data

US 2008/0286565 A1 Nov. 20, 2008

(30) Foreign Application Priority Data

Nov. 6, 2006 (JP) ................................. 2006-300644

(51) Int. Cl.
| | | |
|---|---|---|
| C30B 15/14 | (2006.01) | |
| C30B 15/20 | (2006.01) | |
| C30B 25/20 | (2006.01) | |
| C30B 29/06 | (2006.01) | |
| C30B 33/02 | (2006.01) | |
| H01L 21/322 | (2006.01) | |

(52) U.S. Cl.
CPC ............ *C30B 15/206* (2013.01); *C30B 25/20* (2013.01); *C30B 29/06* (2013.01); *C30B 33/02* (2013.01); *H01L 21/3225* (2013.01)
USPC ........ 117/106; 117/2; 117/3; 117/84; 117/88; 117/90; 117/94; 117/97

(58) Field of Classification Search
USPC ................. 117/2, 3, 84, 88, 90, 94, 97, 106
See application file for complete search history.

(56) References Cited

U.S. PATENT DOCUMENTS 5,704,973 A * 1/1998 Sakurada et al. ............... 117/15
6,277,193 B1 8/2001 Sadamitsu et al.
(Continued)

FOREIGN PATENT DOCUMENTS

EP  0 954 018 A1  11/1999
JP  10-223641     8/1998
(Continued)

OTHER PUBLICATIONS

Japan Office action that issued with respect to patent family member Japanese Patent Application No. 2006-300644, dated Mar. 29, 2011 along with an english translation thereof.

(Continued)

*Primary Examiner* — Matthew Song
(74) *Attorney, Agent, or Firm* — Greenblum & Bernstein, P.L.C.

(57) ABSTRACT

A method for manufacturing an epitaxial wafer includes: a step of pulling a single crystal from a boron-doped silicon melt in a chamber based on a Czochralski process; and a step of forming an epitaxial layer on a surface of a silicon wafer sliced from the single crystal. The single crystal is allowed to grow while passed through a temperature region of 800 to 600° C. in the chamber in 250 to 180 minutes during the pulling step. The grown single crystal has an oxygen concentration of $10 \times 10^{17}$ to $12 \times 10^{17}$ atoms/cm$^3$ and a resistivity of 0.03 to 0.01 $\Omega$cm. The silicon wafer is subjected to pre-annealing prior to the step of forming the epitaxial layer on the surface of the silicon wafer, for 10 minutes to 4 hours at a predetermined temperature within a temperature region of 650 to 900° C. in an inert gas atmosphere. The method is to fabricate an epitaxial wafer that has a diameter of 300 mm or more, and that attains a high IG effect, and involves few epitaxial defects.

15 Claims, 3 Drawing Sheets

(56) References Cited

U.S. PATENT DOCUMENTS

| | | | |
|---|---|---|---|
| 6,334,896 B1 * | 1/2002 | Iida et al. | 117/20 |
| 6,387,466 B1 * | 5/2002 | Fusegawa et al. | 428/64.1 |
| 6,547,875 B1 | 4/2003 | Nakajima et al. | |
| 6,599,816 B2 * | 7/2003 | Sueoka et al. | 438/471 |
| 2002/0009862 A1 | 1/2002 | Mun | |
| 2002/0017234 A1 * | 2/2002 | Ono et al. | 117/13 |
| 2002/0081440 A1 * | 6/2002 | Murakami et al. | 428/446 |
| 2003/0008447 A1 * | 1/2003 | Asayama et al. | 438/200 |
| 2004/0216659 A1 * | 11/2004 | Asayama et al. | 117/2 |
| 2005/0150445 A1 * | 7/2005 | Kim et al. | 117/13 |
| 2006/0150894 A1 * | 7/2006 | Kobayashi | 117/84 |

FOREIGN PATENT DOCUMENTS

| | | |
|---|---|---|
| JP | 2000-016897 | 1/2000 |
| JP | 2000-306916 | 11/2000 |
| JP | 2001-44207 | 2/2001 |
| JP | 2001-156074 | 6/2001 |
| JP | 2001-217251 | 8/2001 |
| JP | 2002-198375 | 7/2002 |
| JP | 2004-091221 | 3/2004 |
| JP | 2004-91221 | 3/2004 |
| KR | 2000-0057350 | 9/2000 |
| TW | 528816 | 4/2003 |

OTHER PUBLICATIONS

Taiwan Office action that issued with respect to patent family member Taiwanese Patent Application No. 10020662930, dated Jun. 28, 2011 along with an english translation thereof.

* cited by examiner

METHOD FOR MANUFACTURING EPITAXIAL WAFER

BACKGROUND OF THE INVENTION

1. Field of the Invention

The present invention relates to improvements in a method for manufacturing an epitaxial wafer used for a highly integrated semiconductor device, and, more particularly to a method for manufacturing an epitaxial wafer, which aims at forming an epitaxial layer on a silicon wafer sliced from silicon single crystal that grows based on a Czochralski process (hereinafter referred to as "CZ process").

2. Description of the Related Art

Hitherto, an epitaxial wafer used as a substrate of a highly integrated device has been fabricated by forming an epitaxial layer on a silicon wafer sliced from a silicon single crystal that grows based on a Czochralski process (hereinafter referred to as "CZ process").

The CZ process is a method of melting polysilicon filled in a crucible under heating with a heater and then dipping seed crystal into a surface portion of the silicon melt to rotate and allow the crystal to grow, and pulling up the crystal to complete a single crystal. If a surface of a silicon wafer (hereinafter referred to as "epi-sub wafer) sliced from the single crystal formed with the CZ process involves dislocation or crystal defects such as oxygen-induced stacking faults (hereinafter referred to as "OSFs"), an epitaxial layer formed on the epi-sub wafer surface has epitaxial defects due to these defects.

The epitaxial defects cause an increase in leak current or a decrease in lifetime in a device active region of a wafer on which fine circuit patterns are formed in response to recent tendencies to increase the device integration degree. Thus, the epitaxial defects should be reduced or removed.

However, there is a problem that even if an epitaxial wafer having high crystallinity with few epitaxial defects is used, device characteristics would be degraded in the case where an epitaxial layer is contaminated with metal impurities in a subsequent device process.

The higher the device integration degree, the more the process is complicated and the more the epitaxial layer is contaminated. As a result, the contamination of the epitaxial layer with impurities of metal elements largely affects the finished quality. Basically, a metal contaminant is prevented by performing the entire process under a clean atmosphere with clean materials. However, it is difficult to completely remove the metal contaminant in the device process. As a countermeasure against this problem, development of a gettering technique for the epi-sub wafer is important. The gettering technique is a process of getting impurity elements that intrude into the epitaxial layer due to contamination, out of the device active region toward a gettering sink, and rendering the elements harmless in the device active region.

To describe an example of the gettering technique, so-called intrinsic gettering (hereinafter referred to as "IG") has been known. This technique traps impurity elements with a bulk micro defect (hereinafter referred to as "BMD") induced during heat treatment of the device process. However, a silicon wafer is subjected to high-temperature heat treatment at 1050 to 1200° C. during a step of forming an epitaxial layer. As a result, minute nuclei of oxygen precipitation in a wafer sliced from silicon single crystal are reduced and annihilated, making it difficult to induce enough BMDs as a gettering source in the wafer. This causes a problem in that even if the gettering technique is applied, the IG is not so effective against the metal impurities throughout the entire process.

To that end, proposed is a manufacturing method for suppressing generation of epitaxial defects to fabricate an epitaxial wafer with a high IG effect (for example, refer to Patent Document 1). This method rapidly reduces the temperature of silicon single crystal at a cooling rate of 3.0° C./min or more (hereinafter referred to as "rapid cooling") while the silicon single crystal being passed through a temperature region of 1100 to 900° C. during a pulling step to reduce a size of each nucleus of oxygen precipitation to a micronuclei to thereby largely suppress generation of the epitaxial defects.

To detail this method, in the case where silicon single crystal having a diameter of 200 mm is allowed to grow in a crucible containing boron-doped silicon melt in a chamber based on the CZ process, the silicon single crystal is pulled up to a length of 500 mm at a pulling rate of 1.1 mm/min to form a straight body and then further pulled up to the length of 550 mm at a higher pulling rate of 1.8 mm/min. Subsequently, the pulling rate is set to 1.1 mm/min again, and the silicon single crystal is pulled to the length of 1000 mm. By changing the pulling rate in this way, the silicon single crystal can be rapidly cooled at a cooling rate of 3° C./min or more while passed through a temperature region of 1100 to 900° C. during the pulling step. A silicon wafer sliced from the silicon single crystal is subjected to heat treatment for 2 hours at 850° C. in a mixed atmosphere of oxygen and an inert gas. Owing to the heat treatment, thermal stability of the nuclei of oxygen precipitation in the crystal of the silicon wafer increases, so BMDs are neither reduced nor annihilated even through the high-temperature heat treatment in the epitaxial layer forming step. Then, the heat-treated silicon wafer is mirror-polished and then placed in an epitaxial device and subjected to hydrogen baking for 1 minute at 1150° C. Following this, a material gas is supplied while the device temperature is set and kept at 1075° C. for a predetermined period. As a result, a 5 μm-thick epitaxial layer is formed on the wafer surface to complete an epitaxial wafer.

However, in the process of pulling a silicon single crystal, a cooling rate tends to differ between a central portion and a peripheral portion of the silicon single crystal due to a structural problem that the central portion is difficult to cool but the peripheral portion is easy to cool. A single crystal having a diameter of 300 mm strongly shows this tendency. It is difficult to attain cooling conditions that the cooling rate is 3° C./min or more in the central portion. Even in the case where the cooling conditions that the cooling rate is 3° C./min or more are satisfied by placing a coolant, if the single crystal involves dislocation, cracks might develop in the single crystal due to a residual stress caused by excessive rapid cooling. In this case, there is a fear that the single crystal cannot be pulled up. Therefore, it is difficult to apply the cooling conditions disclosed in Patent Document 1 to growth of single crystal having the diameter of 300 mm or more as it is.

Patent Document 1

Japanese Unexamined Patent Application Publication No. 2004-91221 (claims 5 and 7, paragraphs [0013] to [0017], [0023], [0024], [0026], and [0027] in the specification, FIG. 1

SUMMARY OF THE INVENTION

Accordingly, the object of the present invention is to provide a method for manufacturing an epitaxial wafer that has a diameter of 300 mm or more, attains a high IG effect, and involves few epitaxial defects. The other object of the present invention is to provide a method for manufacturing an epitaxial wafer with a wide process margin and higher productivity.

As shown in FIG. 2, a first aspect of the present invention pertains to improvements in a method for manufacturing an epitaxial wafer, including: a step of pulling a silicon single crystal 12 from a boron-doped silicon melt 11 in a chamber 21 based on a CZ process; and a step of forming an epitaxial layer on a surface of a silicon wafer sliced from the silicon single crystal 12.

A feature in this method is that the silicon single crystal 12 is allowed to grow while passed through a temperature region of 800 to 600° C. in the chamber 21 in 250 minutes or less and 180 minutes or more during the pulling step. The grown silicon single crystal 12 has an oxygen concentration of $10 \times 10^{17}$ to $12 \times 10^{17}$ atoms/cm$^3$ (ASTMF121-1979) and a resistivity of 0.03 to 0.01 Ωcm. The silicon wafer is subjected to pre-annealing prior to the step of forming the epitaxial layer on the surface of the silicon wafer, for 10 minutes to 4 hours at a predetermined temperature within a temperature region of 650 to 900° C. in an inert gas atmosphere.

In the method for manufacturing an epitaxial wafer according to the first aspect, the silicon single crystal 12 is slowly cooled (hereinafter referred to as "slow cooling") while passed through a temperature region of 800 to 600° C. in the chamber 21 in 250 minutes or less and 180 minutes or more during the pulling step to thereby increase the density of oxygen precipitate nuclei formed in the silicon single crystal 12. The increased oxygen precipitate nuclei are pre-annealed and turned into oxygen precipitates (BMDs). After the high-temperature heat treatment in the step of forming an epitaxial layer, the obtained BMDs have a size enough not to re-dissolve or annihilate. An epitaxial layer is formed on the wafer surface to complete an epitaxial wafer having a high BMD density and a high IG effect.

Further, if the oxygen concentration exceeds $12 \times 10^{17}$ atoms/cm$^3$, the BMDs on the wafer surface generated upon the high-temperature heat treatment in the step of forming an epitaxial layer cannot be completely removed even through pre-annealing, and epitaxial defects develop from the BMDs. However, according to the present invention, an oxygen concentration of the grown single crystal is set as low as $10 \times 10^{17}$ to $12 \times 10^{17}$ atoms/cm$^3$. Thus, even if the single crystal is highly doped with boron, generation of epitaxial defects can be prevented.

According to a second aspect of the present invention, in the method according to the first aspect, a rate of temperature increase from room temperature to the predetermined temperature for pre-annealing is 1 to 8° C./min and a rate of temperature decrease from the predetermined temperature to the room temperature is 5 to 2° C./min. In the method for manufacturing an epitaxial wafer according to the second aspect, the above temperature increase and degrees rates are set in the pre-annealing step, so a desired BMD density is ensured. As the pre-annealing temperature is increased, a period for holding a silicon wafer is reduced. Hence, productivity can be improved.

As shown in FIG. 3, a third aspect of the present invention pertains to improvements in a method for manufacturing an epitaxial wafer, including: a step of pulling a silicon single crystal 12 from a boron-doped silicon melt 11 in a chamber 21 through forced cooling based on a CZ process; and a step of forming an epitaxial layer on a surface of a silicon wafer sliced from the silicon single crystal 12.

A feature in this method is that the silicon single crystal 12 is allowed to grow while passed through a temperature region of 800 to 600° C. in the chamber 21 in less than 180 minutes and 120 minutes or more during the pulling step, the grown silicon single crystal 12 has an oxygen concentration of $10 \times 10^{17}$ or more and $14 \times 10^{17}$ atoms/cm$^3$ or less (ASTMF121-1979) and a resistivity of 0.03 to 0.01 Ωcm, and the silicon wafer is subjected to pre-annealing prior to the step of forming the epitaxial layer on the surface of the silicon wafer, for 10 minutes to 4 hours at a predetermined temperature within a temperature region of 650 to 900° C. in an inert gas atmosphere.

In the method for manufacturing an epitaxial wafer according to the third aspect, the silicon single crystal 12 is allowed to grow while passed through a temperature region of 800 to 600° C. in the chamber 21 in less than 180 minutes and 120 minutes or more during the pulling step. As a result of pre-annealing the thus-prepared single crystal 12, BMDs have a size enough not to re-dissolve or annihilate, through the high-temperature heat treatment in the step of forming an epitaxial layer. An epitaxial layer is formed on the wafer surface to complete an epitaxial wafer having a high BMD density and a high IG effect.

Further, even if the grown crystal is highly doped with boron or its oxygen concentration is as high as $10 \times 10^{17}$ to $14 \times 10^{17}$ atoms/cm$^3$, it is possible to prevent epitaxial defects from developing from the BMDs owing to an operation of growing the silicon single crystal while the crystal being passed through a temperature region of less than 800 to 600° C. in the chamber 21 in less than 180 minutes and 120 minutes or more during the pulling step to thereby suppress generation of an excessive amount of oxygen precipitate nuclei. As a result, a process margin of an oxygen concentration can be set as large as $10 \times 10^{17}$ to $14 \times 10^{17}$ atoms/cm$^3$. The term process margin means an oxygen concentration range or a specific resistance ratio in a manufacturing process, which ensure a desired BMD density without generating epitaxial defects. If the process margin is large, upon industrial production of the silicon single crystal 12, a rejection rate can be reduced even when process characteristics such as the oxygen concentration and specific resistance vary to same degree. The processing time is as short as less than 180 minutes and 120 minutes or more, so its productivity can be improved.

According to a fourth aspect of the present invention, in the method according to the third aspect, a rate of temperature increase from room temperature to the predetermined temperature for pre-annealing is 1 to 8° C./min and a rate of temperature decrease from the predetermined temperature to the room temperature is 5 to 2° C./min. In the method for manufacturing an epitaxial wafer according to the fourth aspect, the above temperature increase and decrease rates are set in the pre-annealing step, so a desired BMD density is ensured. As the pre-annealing temperature is increased, a period for holding a silicon wafer is reduced. Hence, productivity can be improved.

According to a fifth aspect of the present invention, in the method according to the third or fourth aspect, the forced cooling is performed with a water-cooling type cooling device 36 placed in the chamber 21. In the method for manufacturing an epitaxial wafer according to the fifth aspect, the cooling device 36 is a cooling-water type, so the silicon single crystal 12 can be securely cooled.

A sixth aspect of the present invention pertains to an epitaxial wafer, which includes epitaxial defects having a size of 0.09 μm or more on a surface of an epitaxial layer of the wafer at a defect density of 3 defects/wafer or less, and oxygen precipitates formed in the wafer except the epitaxial layer at a density of $1 \times 10^4$/cm$^2$ or more and $5 \times 10^6$/cm$^2$ or less. In the epitaxial wafer according to the sixth aspect, a leak current is reduced, a lifetime is increased, and a high IG effect is attained.

According to the method for manufacturing an epitaxial wafer of the present invention, in the process of growing silicon single crystal that would be sliced into a wafer later, the silicon single crystal is allowed to grow while passed through a temperature region of 800 to 600° C. in a chamber in 250 minutes or less and 180 minutes or more during the pulling step. Further, the grown silicon single crystal is subjected to pre-annealing prior to formation of an epitaxial layer on the surface of a silicon wafer, for 10 minutes to 4 hours at a predetermined temperature within a temperature region of 650 to 900° C. in an inert gas atmosphere to thereby grow BMDs as a gettering sink to enhance an IG effect.

Further, even if the grown crystal is highly doped with boron, since its oxygen concentration is as low as 10 to $12\times10^{17}$ atoms/cm$^3$, it is possible to provide a high-quality epitaxial wafer with few epitaxial defects. The silicon single crystal is allowed to grow while passed through a temperature region of less than 800 to 600° C. in a chamber including a cooling device in less than 180 minutes and 120 minutes or more during a pulling step. In this case, an oxygen concentration can be increased, a process margin is wide, and its productivity can be improved.

DETAILED DESCRIPTION OF THE PREFERRED EMBODIMENTS

First Embodiment

Figure 2:
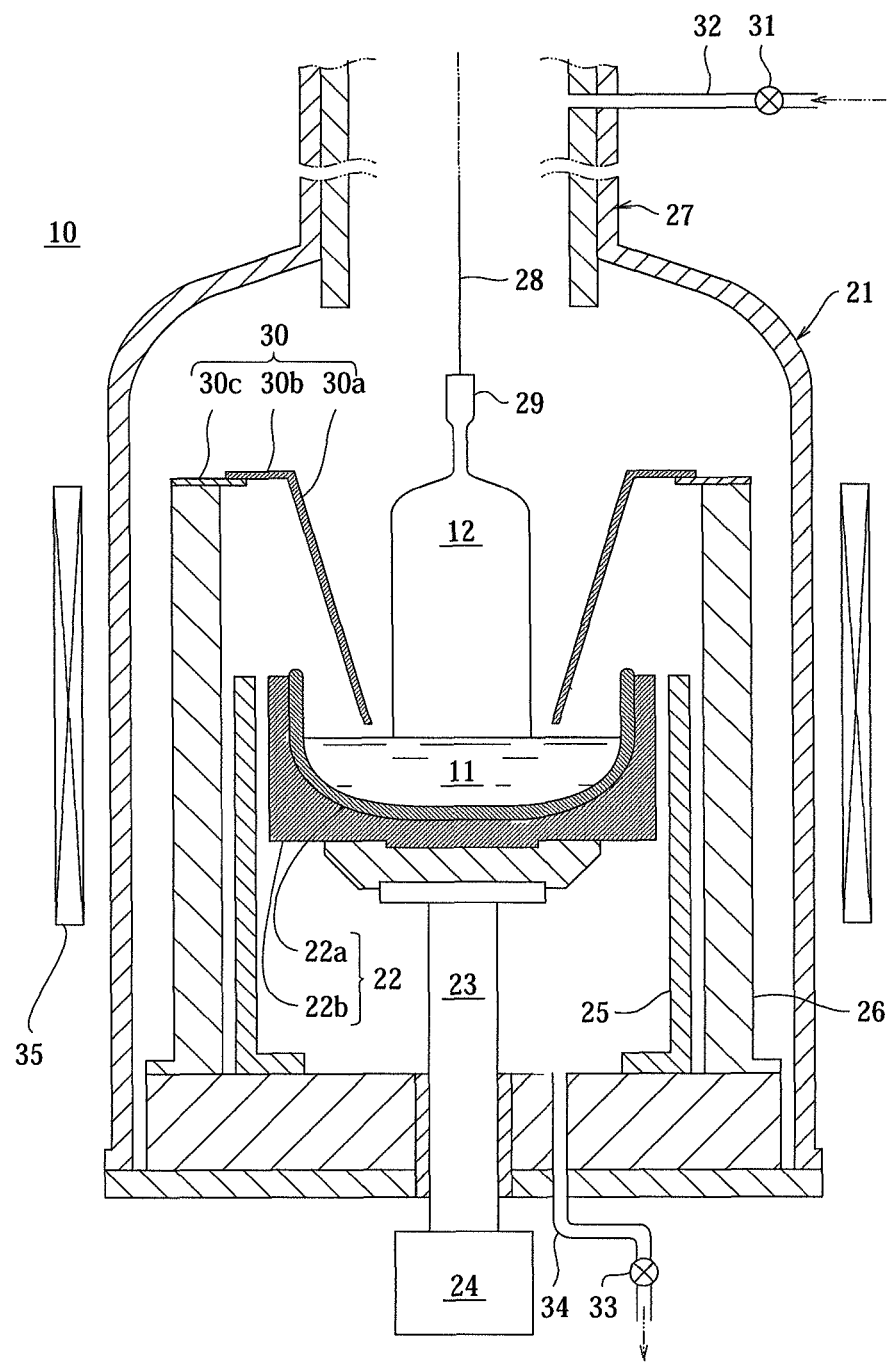
FIG. 2 is a longitudinal sectional view showing a CZ furnace according to a first embodiment of the present invention.

A first embodiment of the present invention will be described. As shown in FIG. 2, a method for manufacturing an epitaxial wafer of the present invention includes: a step of pulling a silicon single crystal 12 from a boron-doped silicon melt 11 in a chamber 21 based on a CZ process; and a step of forming an epitaxial layer on a surface of a silicon wafer (not shown) sliced from the silicon single crystal. In the method for manufacturing an epitaxial wafer, the silicon single crystal 12 is allowed to grow while passed through a temperature region of 800 to 600° C. in the chamber 21 in 250 minutes or less and 180 minutes or more during the pulling step. The grown silicon single crystal 12 has an oxygen concentration of $10\times10^{17}$ to $12\times10^{17}$ atoms/cm$^3$ and a resistivity of 0.03 to 0.01 Ωcm. The silicon wafer is subjected to pre-annealing prior to the step of forming the epitaxial layer on the surface of the silicon wafer sliced from the silicon single crystal, for 10 minutes to 4 hours at a predetermined temperature within a temperature region of 650 to 900° C. in an inert gas atmosphere. The silicon single crystal 12 preferably has the diameter of 300 mm or more, more preferably, 300 to 450 mm.

As for the silicon single crystal 12 that grows in the silicon melt 11 highly doped with boron as a P-type impurity and a silicon wafer used as a sub-wafer of the epitaxial wafer, a resistivity is set to 0.03 to 0.01 Ωcm and a conductivity is set to p+ for the following reasons. First, a p+ wafer has an effect of preventing a so-called latch-up phenomenon that floating charges generated upon device operations operate an unintended parasitic transistor as a design problem, and thus facilitates device design. Second, the p+ wafer can prevent a depletion layer from growing around a trench upon voltage application on condition that a trench type capacitor is used.

In general, oxygen precipitation tends to occur in the silicon single crystal having a resistivity of 0.03 to 0.01 Ωcm due to a high concentration of boron in crystal. To remove ring-shaped OSFs (hereinafter referred to as "R-OSFs") that would cause epitaxial defects from the center of the single crystal, a method of pulling the single crystal at a low speed has been known. However, if the single crystal is pulled at a high speed, R-OSFs are generated in the single crystal. In this case, if an oxygen concentration is high, epitaxial defects are generated at positions in the epitaxial layer corresponding to the R-OSFs on the silicon wafer surface. In general, an oxygen concentration of the silicon wafer is set to a higher value, $10\times10^{17}$ to $14\times10^{17}$ atoms/cm$^3$, preferably, $12\times10^{17}$ to $14\times10^{17}$ atoms/cm$^3$ so that oxygen precipitation proceeds. In the first embodiment of the present invention, the oxygen concentration of the silicon wafer is set as low as $10\times10^{17}$ to $12\times10^{17}$ atoms/cm$^3$, preferably, $10\times10^{17}$ or more and $11\times10^{17}$ atoms/cm$^3$ or less to thereby suppress generation of epitaxial defects derived from the R-OSFs. In addition, generation of epitaxial defects derived from oxygen precipitates can be suppressed even after pre-annealing. The reason the oxygen concentration is set to $10\times10^{17}$ to $12\times10^{17}$ atoms/cm$^3$ is that BMDs annihilate through heat treatment in a step of forming an epitaxial layer and an IG effect is weakened at the oxygen concentration of less than $10\times10^{17}$ atoms/cm$^3$. Further, if the oxygen concentration exceeds $12\times10^{17}$ atoms/cm$^3$, there is a fear that R-OSFs grow on the surface of an epi-sub wafer sliced from the single crystal and induce epitaxial defects caused by R-OSFs in an epitaxial layer formed on the epi-sub wafer surface, or epitaxial defects are induced by BMDs due to an excessive amount of precipitates.

A procedure for pulling the silicon single crystal 12 to fabricate such a silicon wafer is described next. First, a boron is doped to the silicon melt 11 filled in a crucible 22 placed in a hot zone in the main chamber 21 of a CZ furnace such that the grown silicon single crystal 12 has a resistivity of 0.03 to 0.01 Ωcm, and the silicon single crystal 12 is pulled at a rate of 0.7 mm/min to 1.1 mm/min.

The temperature of the silicon single crystal 12 is decreased from the interface with the silicon melt 11 toward the top of the silicon single crystal 12. The whole CZ furnace is designed such that the silicon temperature is about 1400° C. at the melt interface, 800° C. in a lower portion of the pull chamber 27, and about 600° C. in a portion above the lower portion of the pull chamber 27. The silicon single crystal 12 is passed through the temperature region of 800 to 600° C. in the chamber 21 in 250 minutes or less and 180 minutes or more during the pulling step, and thus is slowly cooled. At this time, a rate of temperature decrease is 0.80 to 1.11° C./min. In the single crystal, oxygen precipitate nuclei are thereby generated. Since the single crystal is held within this temperature region for a long time, a density of oxygen precipitate nuclei can be increased. A problem about a low BMD density in an epitaxial layer due to a low oxygen concentration can be solved. The reason the processing time is 250 minutes or less and 180 minutes or more is that the BMD density can be increased without a cooling device in the chamber 21 if the processing time is 180 minutes or more, and the BMD density can be increased without reducing a productivity if the processing time is 250 minutes or less.

The grown silicon single crystal 12 is processed into a silicon wafer in accordance with a general method. For example, the single crystal is sliced with an inner diameter slicer or wire saw after grinding and orientation flat grinding, and is subjected to chamfering and lapping and then chemical etching to remove a mechanically damaged layer.

The oxygen precipitate nuclei generated in the silicon wafer sliced from the slowly-cooled silicon single crystal 12 are turned into BMDs having a size enough not to re-dissolve or annihilate even through high-temperature heat treatment in the step of forming an epitaxial layer by pre-annealing the silicon wafer prior to the step of forming an epitaxial layer. As a result, a problem about a low BMD density in the epitaxial wafer is solved and an IG effect can be enhanced.

Figure 1:
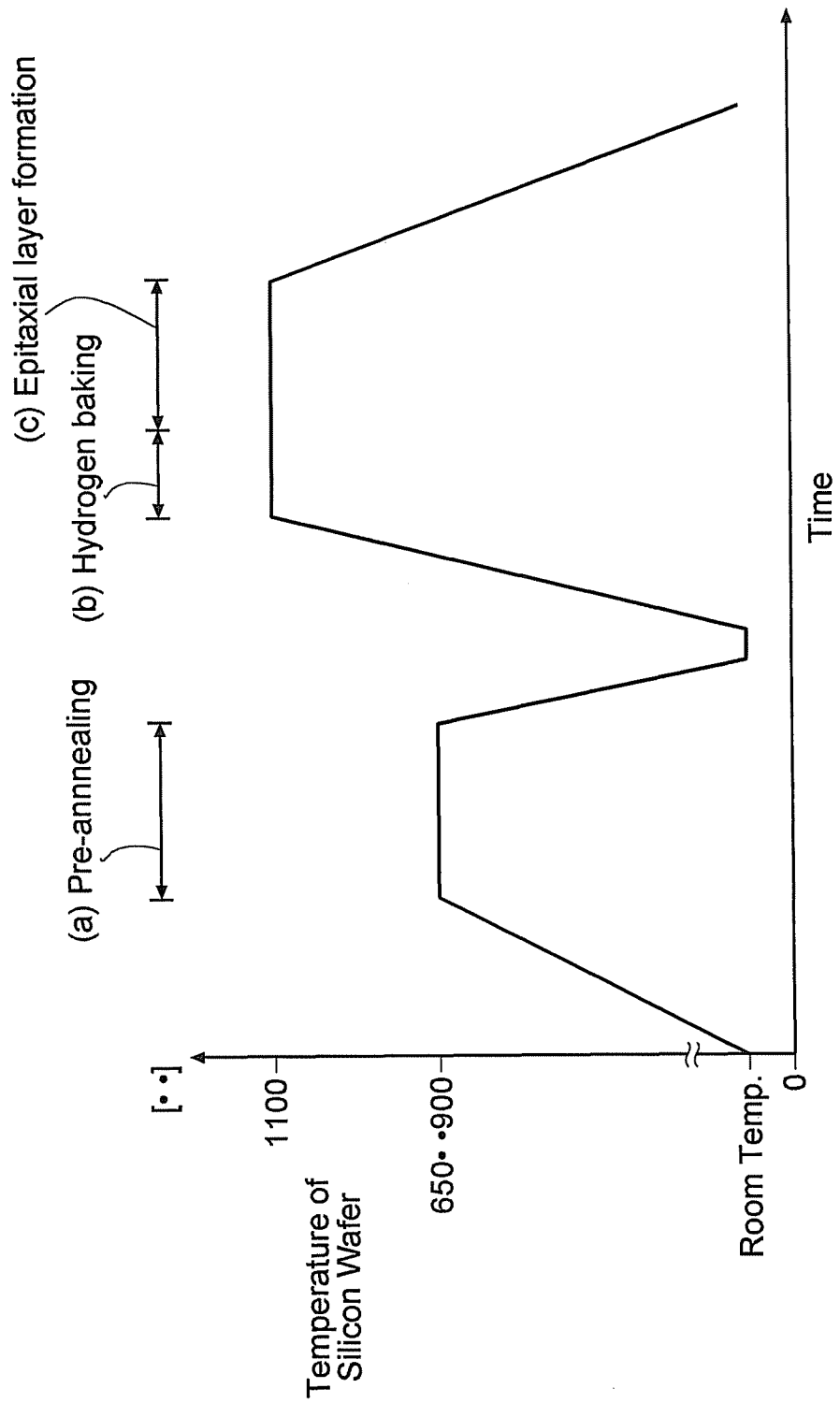
FIG. 1 is a graph showing a relationship between heat treatment time of a silicon wafer and a temperature profile according to the present invention.

A procedure of the step of pre-annealing the silicon wafer to turn the oxygen precipitate nuclei into BMDs is described next. As shown in FIG. 1, in the pre-annealing step, the etched silicon wafer left to stand at room temperature is placed in a resistance heating type vertical furnace that is set to 600 to 700° C. The temperature is raised at a rate of 1 to 8° C./min, preferably 4 to 6° C./min up to a predetermined temperature within a temperature region of 650 to 900° C. The wafer is held at the predetermined temperature for 10 minutes to 4 hours, preferably 30 to 60 minutes, and then cooled at a rate of temperature decrease of 5 to 2° C./min, preferably 4 to 3° C./min. A furnace atmosphere is an inert gas atmosphere containing a nitrogen ($N_2$) gas, an argon gas, or a mixture gas thereof.

The pre-annealed silicon wafer is polished into a mirror-surface wafer with luster. An epitaxial layer is allowed to glow on the thus-mirror-finished silicon wafer. For example, if the silicon wafer is placed in a single-wafer epitaxial device and subjected to hydrogen baking at a device temperature of 1000 to 1150° C. for 1 minutes and subsequently exposed to a trichlorosilane gas introduced into the device and held at 1000 to 1150° C. for 30 to 180 seconds, preferably 60 to 120 seconds, a 4 µm-thick epitaxial layer is formed on the silicon wafer surface. As a result, the epitaxial layer is completed with epitaxial defects having a size of 0.09 µm or more on the epitaxial layer surface at a defect density of 3 defects/wafer or less, and BMDs generated in the wafer except for the epitaxial layer at a density of $1 \times 10^4/cm^2$ to $5 \times 10^6/cm^2$.

Second Embodiment

Figure 3:
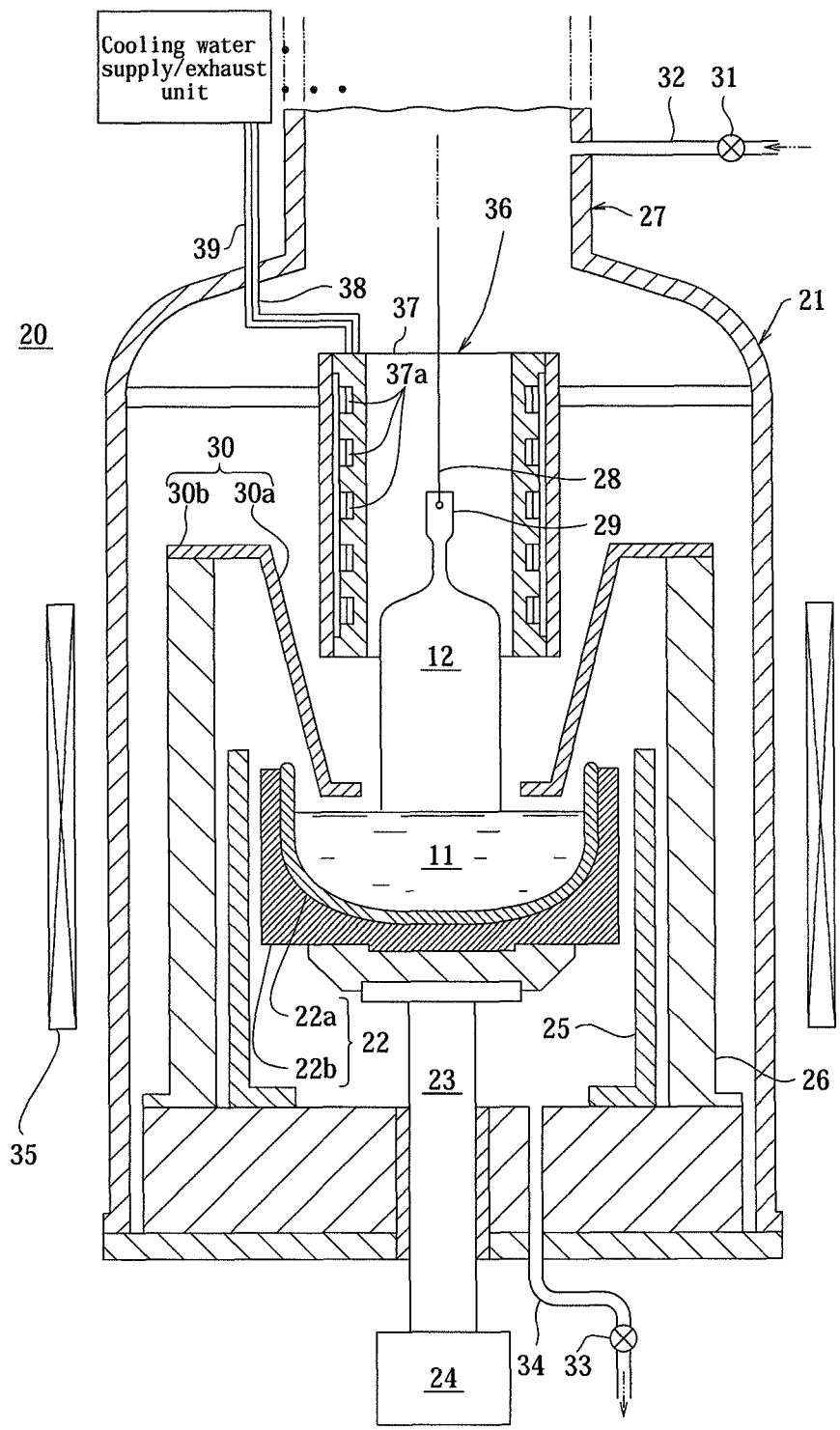
FIG. 3 is a longitudinal sectional view showing a CZ furnace according to a second embodiment of the present invention.

A second embodiment of the present invention will be described. A method for manufacturing an epitaxial wafer of the present invention includes: a step of pulling the silicon single crystal 12 having the diameter of 300 mm from the boron-doped silicon melt 11 in the chamber 21 through forced cooling based on a CZ process; and a step of forming an epitaxial layer on a surface of a silicon wafer sliced from the silicon single crystal. That is, in the second embodiment, as shown in FIG. 3, forced cooling is carried out with the water-cooling type cooling device 36 placed in the chamber 21. The silicon single crystal 12 is passed through a cooling cylindrical member 37 placed in the cooling device 36 and allowed to grow while passed through a temperature region of 800 to 600° C. in the chamber 21 in less than 180 minutes and 120 minutes or more during the pulling step. The grown silicon single crystal 12 has an oxygen concentration of $10 \times 10^{17}$ to $14 \times 10^{17}$ atoms/cm³ and a resistivity of 0.03 to 0.01 Ωcm. The silicon single crystal 12 preferably has the diameter of 300 mm or more, more preferably, 300 to 450 mm. A silicon wafer sliced from the single crystal is subjected to pre-annealing prior to the step of forming the epitaxial layer on the surface of the silicon wafer, for 10 minutes to 4 hours at a predetermined temperature within a temperature region of 650 to 900° C. in an inert gas atmosphere. A rate of temperature increase from room temperature and a rate of temperature decrease to room temperature are the same as those of the first embodiment.

According to the present invention, the reason the processing time in a temperature region of 800 to 600° C. during the pulling step is set to less than 180 minutes and 120 minutes or more is that the BMD density can be increased in the silicon single crystal 12 if the processing time is 120 minutes or more. Incidentally, if a cooling device is placed in the chamber 21, the processing time of the silicon single crystal 12 can be set to less than 180 minutes and 120 minutes or more. Further, the silicon is cooled in a shorter period, less than 180 minutes and 120 minutes or more, so productivity is higher than that of the first embodiment.

Further, the reason a process margin of the oxygen concentration is set as large as $10 \times 10^{17}$ to $14 \times 10^{17}$ atoms/cm³ is that the silicon is passed through a temperature region of 800 to 600° C. in the chamber 21 in less than 180 minutes and 120 minutes or more during the pulling step to suppress generation of an excessive amount of oxygen precipitate nuclei. Thus, it is possible to prevent epitaxial defects from being generated due to BMDs induced by an excessive amount of oxygen precipitates even in the silicon single crystal 12 having a resistivity of 0.03 to 0.01 Ωcm, which is highly doped with boron or has a high oxygen concentration. Further, if the process margin of the oxygen concentration is high, upon mass production of the silicon single crystal 12, a rejection rate can be reduced even when process characteristics such as the oxygen concentration and specific resistance vary to same degree.

EXAMPLES

Examples of the present invention and Comparative Examples will be described hereinbelow.

Example 1

The CZ furnace 10 for growing the single crystal grows is shown in FIG. 2. To be specific, the crucible 22 for retaining the silicon melt 11 is placed at the center of the main chamber 21. The crucible 22 includes a quartz container 22a and a graphite container 22b surrounding the container 22a and is connected to a crucible driving unit 24 for rotatingly moving the crucible 22 up/down through a pivot 23. A heater 25 and a heat insulating tube 26 are concentrically arranged around the crucible 22. The silicon melt 11 prepared by melting the single crystal with the heater 25 is filled in the crucible 22.

A cylindrical pull chamber 27 is connected to the upper end of the main chamber 21, and a seed pulling unit (not shown) is provided at the upper end of the pull chamber 27. A wire cable 28, from which a seed crystal 29 is suspended, is set in a rotatable and vertically movable state. The silicon single crystal 12 can be allowed to grow from the lower end of the seed crystal 29. A heat shielding member 30 is placed to surround the silicon single crystal 12 that grows as the wire cable 28 is lifted. The heat shielding member 30 is composed of a cone portion 30a that reduces its diameter toward the bottom, a flange portion 30b that is continuous to the cone portion and extends outwardly, and a ring place 30c for placing the flange portion 30b on the heat insulating tube 26.

Further, the furnace is structured such that an argon gas flows through a gas supply pipe 32 having a supply gas flow rate control valve 31 and a gas exhaust pipe 34 having an exhaust gas flow rate control valve 33 and thus circulates in the pull chamber 27 and the main chamber 21. Moreover, a magnetic field applying device 35 is placed on both sides of the man chamber 21 to control convection of the silicon melt 11.

The thus-structured CZ furnace 10 was used to pull the silicon single crystal 12 from the boron-doped silicon melt 11 at a rate of 0.95 mm/min while introducing an inert gas as a carrier gas into the chamber 21. The silicon single crystal 12 was allowed to grow while passed through a temperature region of 800 to 600° C. in 182 minutes during the pulling step. A rotational speed of the crucible 22 was adjusted, and a magnetic field intensity was adjusted by the magnetic field applying device 35 based on a MCZ (magnetic field applied CZ) method. A flow rate of the argon gas and a pressure in the CZ furnace 10 were adjusted. An oxygen concentration of the silicon single crystal 12 was thereby controlled. A resistivity and oxygen concentration of a silicon wafer sliced from the single crystal were measured with a four-point probe method and secondary ion mass spectroscopy (SIMS), respectively. The measurement result shows that the resistivity of the silicon single crystal 12 is 0.03 to 0.01 Ωcm, and the oxygen concentration is $10.05 \times 10^{17}$ atoms/cm$^3$.

The silicon wafer subjected to chemical etching was placed in a vertical furnace heated to 650° C. Next, pre-annealing process was performed such that under a nitrogen gas atmosphere, the inner temperature of the vertical furnace was raised from 650° C. to 850° C. at a temperature increase rate of 5° C./min, and the silicon wafer was held in 1 hour at 850° C. and cooled down to room temperature at a temperature decrease rate of 3° C./min. The silicon wafer was mirror-polished, and put in a single-wafer epitaxial device and subjected to hydrogen baking for 1 minute at 1100° C. Subsequently, a trichlorosilane gas was introduced into the device and the inner temperature was set and kept at 1100° C. for 120 seconds to thereby form a 4 μm-thick epitaxial layer on the silicon wafer surface. In this way, an epitaxial wafer was completed. The completed epitaxial wafer is referred to as Example 1.

Examples 2 to 6

The processing time for the silicon single crystal 12 in the temperature region of 800 to 600° C. was changed to 250 minutes or less and 180 minutes or more as shown in Table 1 by setting the pulling rate to 0.85 to 0.95 mm/min in the process of growing the single crystal. Further, the rotational speed of the crucible 22 was adjusted, and the magnetic field intensity was adjusted by the magnetic field applying device 35. In addition, a flow rate of the argon gas and a pressure in the CZ furnace 10 were adjusted to change an oxygen concentration of the silicon single crystal 12 within a range of $10 \times 10^{17}$ to $12 \times 10^{17}$ atoms/cm$^3$ as shown in Table 1. The same process as Example 1 was performed except the above to fabricate an epitaxial wafer. The fabricated epitaxial wafers are referred to as Examples 2 to 6.

Comparative Examples 1 to 6

The processing time for the silicon single crystal 12 in the temperature region of 800 to 600° C. was changed to 250 minutes or less and 180 minutes or more as shown in Table 1 by setting the pulling rate to 0.85 to 0.95 mm/min in the process of growing the single crystal. Further, the rotational speed of the crucible 22 was adjusted, and the magnetic field intensity was adjusted by the magnetic field applying device 35. In addition, a flow rate of the argon gas and a pressure in the CZ furnace 10 were adjusted to change an oxygen concentration of the silicon single crystal 12 outside a range of $10 \times 10^{17}$ to $12 \times 10^{17}$ atoms/cm$^3$ as shown in Table 1. The same process as Example 1 was performed except the above to fabricate an epitaxial wafer. The fabricated epitaxial wafers are referred to as Comparative Examples 1 to 6.

Comparative Examples 7 to 10

The processing time for the silicon single crystal 12 in the temperature region of 800 to 600° C. was changed to 250 minutes or less and 180 minutes or more as shown in Table 1 by setting the pulling rate to 0.75 mm/min in the process of growing the single crystal. Further, the rotational speed of the crucible 22 was adjusted, and the magnetic field intensity was adjusted by the magnetic field applying device 35. In addition, a flow rate of the argon gas and a pressure in the CZ furnace 10 were adjusted to change an oxygen concentration of the silicon single crystal 12 as shown in Table 1. The same process as Example 1 was performed except the above to fabricate an epitaxial wafer. The fabricated epitaxial wafers are referred to as Comparative Examples 7 to 10.

Comparative Examples 11 to 22

The processing time for the silicon single crystal 12 in the temperature region of 800 to 600° C. was changed to 250 minutes or less and 180 minutes or more as shown in Table 2 by setting the pulling rate to 0.85 to 0.95 mm/min in the process of growing the single crystal. Further, the rotational speed of the crucible 22 was adjusted, and the magnetic field intensity was adjusted by the magnetic field applying device 35. In addition, a flow rate of the argon gas and a pressure in the CZ furnace 10 were adjusted to change an oxygen concentration of the silicon single crystal 12 as shown in Table 2. Further, an epitaxial layer was formed without pre-annealing. The same process as Example 1 was performed except the above to fabricate an epitaxial wafer. The fabricated epitaxial wafers are referred to as Comparative Examples 11 to 22.

Comparative Examples 23 to 26

The processing time for the silicon single crystal 12 in the temperature region of 800 to 600° C. was changed to 250 minutes or less and 180 minutes or more as shown in Table 2 by setting the pulling rate to 0.75 to 1.05 mm/min in the process of growing the single crystal. Further, the rotational speed of the crucible 22 was adjusted, and the magnetic field intensity was adjusted by the magnetic field applying device 35. In addition, a flow rate of the argon gas and a pressure in the CZ furnace 10 were adjusted to change an oxygen concentration of the silicon single crystal 12 as shown in Table 2. Further, an epitaxial layer was formed without pre-annealing. The same process as Example 1 was performed except the above to fabricate an epitaxial wafer. The fabricated epitaxial wafers are referred to as Comparative Examples 23 to 26.

(Comparison Test 1)

The epitaxial silicon wafers of Examples 1 to 6 and Comparative Examples 1 to 26 were measured of the number of surface defects (epitaxial defects) having a size of 0.09 μm or more detected on the surface of the epitaxial layer with a surface defect inspection device (KLA-Tencor Corporation: SP-1). Next, these epitaxial wafers were held in a dry oxygen ambient for 16 hours at 100° C. and subjected to heat treatment for growing BMDs. Then, the epitaxial wafers were cut and subjected to selective etching with a light etchant by 2 μm along the section. The section was observed with an optical microscope to measure an etching pit density to determine a density of oxygen precipitates (BMDs) generated in the silicon wafer. Tables 1 and 2 summarize the measurement results.

TABLE 1

| | Pulling Rate (mm/min) | Processing Time (min) | Oxygen Concentration ($\times 10^{17}$ atoms/cm$^3$) | Was Cooling Device used or not? | Was Pre-annealing performed or not? | Generation of Epitaxial Defects (defects/Wafer) | BMD Density (defects/cm$^2$) |
|---|---|---|---|---|---|---|---|
| Example 1 | 0.95 | 182 | 10.05 | No | Yes | ≤3 | $4.68 \times 10^4$ |
| Example 2 | 0.95 | 182 | 11.92 | No | Yes | ≤3 | $1.12 \times 10^6$ |
| Example 3 | 0.9 | 214 | 10.17 | No | Yes | ≤3 | $7.20 \times 10^4$ |
| Example 4 | 0.9 | 214 | 11.85 | No | Yes | ≤3 | $1.76 \times 10^6$ |
| Example 5 | 0.85 | 245 | 10.22 | No | Yes | ≤3 | $1.20 \times 10^5$ |
| Example 6 | 0.85 | 245 | 11.81 | No | Yes | ≤3 | $2.26 \times 10^6$ |
| Comparative Example 1 | 0.95 | 182 | 9.74 | No | Yes | ≤3 | $7.80 \times 10^3$ |
| Comparative Example 2 | 0.95 | 182 | 12.67 | No | Yes | ≥100 | $3.44 \times 10^6$ |
| Comparative Example 3 | 0.9 | 214 | 9.86 | No | Yes | ≤3 | $6.50 \times 10^3$ |
| Comparative Example 4 | 0.9 | 214 | 12.36 | No | Yes | ≥100 | $2.49 \times 10^6$ |
| Comparative Example 5 | 0.85 | 245 | 9.57 | No | Yes | ≤3 | $8.22 \times 10^3$ |
| Comparative Example 6 | 0.85 | 245 | 12.73 | No | Yes | ≥100 | $2.76 \times 10^6$ |
| Comparative Example 7 | 0.75 | 265 | 9.64 | No | Yes | ≥50 | $5.60 \times 10^4$ |
| Comparative Example 8 | 0.75 | 265 | 10.35 | No | Yes | ≥50 | $3.20 \times 10^5$ |
| Comparative Example 9 | 0.75 | 265 | 11.71 | No | Yes | ≥100 | $5.80 \times 10^6$ |
| Comparative Example 10 | 0.75 | 265 | 12.49 | No | Yes | ≥100 | $8.20 \times 10^6$ |

TABLE 2

| | Pulling Rate (mm/min) | Processing Time (min) | Oxygen Concentration ($\times 10^{17}$ atoms/cm$^3$) | Was Cooling Device used or not? | Was Pre-annealing performed or not? | Generation of Epitaxial Defects (defects/Wafer) | BMD Density (defects/cm$^2$) |
|---|---|---|---|---|---|---|---|
| Comparative Example 11 | 0.95 | 182 | 9.74 | No | No | ≤3 | $1.3 \times 10^3$ |
| Comparative Example 12 | 0.95 | 182 | 10.05 | No | No | ≤3 | $1.3 \times 10^3$ |
| Comparative Example 13 | 0.95 | 182 | 11.92 | No | No | ≤3 | $3.9 \times 10^3$ |
| Comparative Example 14 | 0.95 | 182 | 12.67 | No | No | ≤3 | $6.5 \times 10^3$ |
| Comparative Example 15 | 0.9 | 214 | 9.86 | No | No | ≤3 | $1.3 \times 10^3$ |
| Comparative Example 16 | 0.9 | 214 | 10.17 | No | No | ≤3 | $1.3 \times 10^3$ |
| Comparative Example 17 | 0.9 | 214 | 11.85 | No | No | ≤3 | $5.2 \times 10^3$ |
| Comparative Example 18 | 0.9 | 214 | 12.36 | No | No | ≤3 | $7.8 \times 10^3$ |
| Comparative Example 19 | 0.85 | 245 | 9.57 | No | No | ≤3 | $1.3 \times 10^3$ |
| Comparative Example 20 | 0.85 | 245 | 10.22 | No | No | ≤3 | $1.3 \times 10^3$ |
| Comparative Example 21 | 0.85 | 245 | 11.81 | No | No | ≤3 | $4.6 \times 10^3$ |

TABLE 2-continued

|  | Pulling Rate (mm/min) | Processing Time (min) | Oxygen Concentration ($\times 10^{17}$ atoms/cm$^3$) | Was Cooling Device used or not? | Was Pre-annealing performed or not? | Generation of Epitaxial Defects (defects/Wafer) | BMD Density (defects/cm$^2$) |
|---|---|---|---|---|---|---|---|
| Comparative Example 22 | 0.85 | 245 | 12.73 | No | No | ≤3 | $8.2 \times 10^3$ |
| Comparative Example 23 | 0.75 | 265 | 9.64 | No | No | ≤3 | $2.6 \times 10^3$ |
| Comparative Example 24 | 0.75 | 265 | 10.35 | No | No | ≤3 | $3.9 \times 10^3$ |
| Comparative Example 25 | 0.75 | 265 | 11.71 | No | No | ≤3 | $9.0 \times 10^3$ |
| Comparative Example 26 | 0.75 | 265 | 12.49 | No | No | ≥50 | $4.2 \times 10^3$ |

(Evaluation 1)

In Tables 1 and 2, the number of epitaxial defects per wafer is an average value of measurements of 3000 epitaxial wafers. As apparent from Tables 1 and 2, an average number of epitaxial defects per wafer is as small as 3 or less in Examples 1 to 6, and Comparative Examples 1, 3, 5 and 11 to 25 but is as large as 50 or more in Comparative Examples 7 to 8, and 26, and is 100 or more in Comparative Examples 2, 4, 6, 9, and 10.

Further, the BMD density is as high as $1 \times 10^4$ defects/cm$^2$ or more in Examples 1 to 6, and Comparative Examples 2, 4, 6 to 10, and 26 but is as low as less than $1 \times 10^4$ defects/cm$^2$ in Comparative Examples 1, 3, 4, and 11 to 25.

As understood from the above result, an average number of epitaxial defects is increased if the oxygen concentration is as high as more than $12 \times 10^{17}$ atoms/cm$^3$ and pre-annealing is performed, so it is preferred to set the upper limit of the oxygen concentration to $12 \times 10^{17}$ atoms/cm$^3$ or less. The BMD density is higher with pre-annealing than without pre-annealing. Thus, it is preferred to perform pre-annealing. Further, even if the processing time is within 180 to 250 minutes, the BMD density is lower than $1 \times 10^4$ defects/cm$^2$ in Comparative Examples 1, 3, and 5. To avoid such a situation, it is preferred to set the lower limit of the oxygen concentration to $10 \times 10^{17}$ atoms/cm$^3$ or more.

As apparent from the result of comparing Examples 1 to 6 and Comparative Examples 1 to 26, if a silicon wafer is sliced from the silicon single crystal 12 that is allowed to grow while passed through a temperature region of 800 to 600° C. in 250 to 180 minutes and has an oxygen concentration of 10 to $12 \times 10^{17}$ atoms/cm$^3$, and the silicon wafer is pre-annealed prior to formation of an epitaxial layer, an epitaxial wafer can be manufactured with a high density of BMDs effective as gettering sites, $1 \times 10^4$ defects/cm$^2$ or more, and a low density of epitaxial defects, 3 or less per wafer.

Example 7

A CZ furnace 20 for growing the single crystal grows is shown in FIG. 3. In FIG. 3, the same components as those of FIG. 2 are denoted by identical reference numerals, so description thereof is omitted here. In the main chamber 21, the cooling device 36 is placed to surround the target 12. In the cooling device 36, a cooling cylindrical member 37 including a cooling water path 37a, a supply pipe 38 communicating with the cooling water path 37a and supplying cooling water to the cooling water path 37a at a predetermined pressure, and an exhaust pipe 39 for draining cooling water from the chamber 21 to the cooling water path 37a.

The thus-structured CZ furnace 20 was used to pull the silicon single crystal 12 from the boron-doped silicon melt 11 at a rate of 1.3 mm/min while introducing an inert gas as a carrier gas into the chamber 21. The silicon single crystal 12 was allowed to grow while passed through a temperature region of 800 to 600° C. in 120 minutes during the pulling step. A rotational speed of the crucible 22 was adjusted, and a magnetic field intensity was adjusted by the magnetic field applying device 35. A flow rate of the argon gas and a pressure in the CZ furnace 20 were adjusted. An oxygen concentration of the silicon single crystal 12 was thereby controlled. A resistivity and oxygen concentration of a silicon wafer sliced from the single crystal were measured with a four-point probe method and secondary ion mass spectroscopy (SIMS), respectively. The measurement result shows that the resistivity of the silicon single crystal 12 is 0.03 to 0.01 Ωcm, and the oxygen concentration is $10.22 \times 10^{17}$ atoms/cm$^3$.

The silicon wafer subjected to chemical etching was placed in a vertical furnace heated to 650° C. Next, pre-annealing process was performed such that under a nitrogen gas atmosphere, the inner temperature of the vertical furnace was raised from 650° C. to 850° C. at a temperature increase rate of 5°/min, and the silicon wafer was held in 1 hour at 850° C. and the cooled down to room temperature a temperature decrease rate of 3°/min. The silicon wafer was mirror-polished, and put in a single-wafer epitaxial device and subjected to hydrogen baking for 1 minute at 1100° C. Subsequently, a trichlorosilane gas was introduced into the device and the inner temperature was set and kept at 1100° C. for 120 seconds to thereby form a 4 μm-thick epitaxial layer on the silicon wafer surface. In this way, an epitaxial wafer was completed. The completed epitaxial wafer is referred to as Example 7.

Examples 8 to 12

The processing time for the silicon single crystal 12 in the temperature region of 800 to 600° C. was changed to less than 180 minutes and 120 minutes or more as shown in Table 3 by setting the pulling rate to 1.3 to 1.0 mm/min in the process of growing the single crystal. Further, the rotational speed of the crucible 22 was adjusted, and the magnetic field intensity was adjusted by the magnetic field applying device 35. In addition, a flow rate of the argon gas and a pressure in the CZ furnace 20 were adjusted to change an oxygen concentration of the silicon single crystal 12 as shown in Table 3. The same process as Example 7 was performed except the above to fabricate an epitaxial wafer. The fabricated epitaxial wafers are referred to as Examples 8 to 12.

Comparative Examples 27 to 32

The processing time for the silicon single crystal 12 in the temperature region of 800 to 600° C. was changed to 250 minutes or less and 180 minutes or more as shown in Table 3 by setting the pulling rate to 1.3 to 1.00 mm/min in the process of growing the single crystal. Further, the rotational speed of the crucible 22 was adjusted, and the magnetic field intensity was adjusted by the magnetic field applying device 35. In addition, a flow rate of the argon gas and a pressure in the CZ furnace 20 were adjusted to change an oxygen concentration of the silicon single crystal 12 as shown in Table 3. The same process as Example 7 was performed except the above to fabricate an epitaxial wafer. The fabricated epitaxial wafers are referred to as Comparative Examples 27 to 32.

Comparative Examples 33 to 36

The processing time for the silicon single crystal 12 in the temperature region of 800 to 600° C. was changed to less than 180 minutes and 120 minutes or more as shown in Table 3 by setting the pulling rate to 1.4 mm/min in the process of growing the single crystal. Further, the rotational speed of the crucible 22 was adjusted, and the magnetic field intensity was adjusted by the magnetic field applying device 35. In addition, a flow rate of the argon gas and a pressure in the CZ furnace 20 were adjusted to change an oxygen concentration of the silicon single crystal 12 as shown in Table 3. The same process as Example 7 was performed except the above to fabricate an epitaxial wafer. The fabricated epitaxial wafers are referred to as Comparative Examples 33 to 36.

Comparative Examples 37 to 42

The processing time for the silicon single crystal 12 in the temperature region of 800 to 600° C. was changed to less than 180 minutes and 120 minutes or more as shown in Table 4 by setting the pulling rate to 1.3 to 1.0 mm/min in the process of growing the single crystal. Further, the rotational speed of the crucible 22 was adjusted, and the magnetic field intensity was adjusted by the magnetic field applying device 35. In addition, a flow rate of the argon gas and a pressure in the CZ furnace 20 were adjusted to change an oxygen concentration of the silicon single crystal 12 as shown in Table 4. Further, an epitaxial layer was formed without pre-annealing. The same process as Example 7 was performed except the above to fabricate an epitaxial wafer. The fabricated epitaxial wafers are referred to as Comparative Examples 37 to 42.

Comparative Examples 43 to 48

The processing time for the silicon single crystal 12 in the temperature region of 800 to 600° C. was changed to less than 180 minutes and 120 minutes or more as shown in Table 4 by setting the pulling rate to 1.3 to 1.0 mm/min in the process of growing the single crystal. Further, the rotational speed of the crucible 22 was adjusted, and the magnetic field intensity was adjusted by the magnetic field applying device 35. In addition, a flow rate of the argon gas and a pressure in the CZ furnace 20 were adjusted to change an oxygen concentration of the silicon single crystal 12 as shown in Table 4. Further, an epitaxial layer was formed without pre-annealing. The same process as Example 7 was performed except the above to fabricate an epitaxial wafer. The fabricated epitaxial wafers are referred to as Comparative Examples 43 to 48.

Comparative Examples 49 to 52

The processing time for the silicon single crystal 12 in the temperature region of 800 to 600° C. was changed to less than 180 minutes and 120 minutes or more as shown in Table 4 by setting the pulling rate to 1.4 mm/min in the process of growing the single crystal. Further, the rotational speed of the crucible 22 was adjusted, and the magnetic field intensity was adjusted by the magnetic field applying device 35. In addition, a flow rate of the argon gas and a pressure in the CZ furnace 20 were adjusted to change an oxygen concentration of the silicon single crystal 12 as shown in Table 4. Further, an epitaxial layer was formed without pre-annealing. The same process as Example 7 was performed except the above to fabricate an epitaxial wafer. The fabricated epitaxial wafers are referred to as Comparative Examples 49 to 52.

TABLE 3

|  | Pulling Rate (mm/min) | Processing Time (min) | Oxygen Concentration ($\times 10^{17}$ atoms/cm$^3$) | Was Cooling Device used or not? | Was Pre-annealing performed or not? | Generation of Epitaxial Defects (defects/Wafer) | BMD Density (defects/cm$^2$) |
|---|---|---|---|---|---|---|---|
| Example 7 | 1.3 | 120 | 10.22 | Yes | Yes | ≤3 | $6.24 \times 10^4$ |
| Example 8 | 1.3 | 120 | 13.87 | Yes | Yes | ≤3 | $2.45 \times 10^6$ |
| Example 9 | 1.1 | 150 | 10.14 | Yes | Yes | ≤3 | $8.52 \times 10^4$ |
| Example 10 | 1.1 | 150 | 13.92 | Yes | Yes | ≤3 | $3.67 \times 10^6$ |
| Example 11 | 1.0 | 170 | 10.07 | Yes | Yes | ≤3 | $4.82 \times 10^4$ |
| Example 12 | 1.0 | 170 | 13.89 | Yes | Yes | ≤3 | $3.89 \times 10^6$ |
| Comparative Example 27 | 1.3 | 120 | 8.86 | Yes | Yes | ≤3 | $8.53 \times 10^3$ |
| Comparative Example 28 | 1.3 | 120 | 14.62 | Yes | Yes | ≥50 | $5.25 \times 10^6$ |

TABLE 3-continued

|  | Pulling Rate (mm/min) | Processing Time (min) | Oxygen Concentration ($\times 10^{17}$ atoms/cm$^3$) | Was Cooling Device used or not? | Was Pre-annealing performed or not? | Generation of Epitaxial Defects (defects/Wafer) | BMD Density (defects/cm$^2$) |
|---|---|---|---|---|---|---|---|
| Comparative Example 29 | 1.1 | 150 | 9.24 | Yes | Yes | ≤3 | $7.26 \times 10^3$ |
| Comparative Example 30 | 1.1 | 150 | 15.02 | Yes | Yes | ≥50 | $5.41 \times 10^6$ |
| Comparative Example 31 | 1.0 | 170 | 9.61 | Yes | Yes | ≤3 | $7.05 \times 10^3$ |
| Comparative Example 32 | 1.0 | 170 | 14.36 | Yes | Yes | ≥100 | $7.24 \times 10^6$ |
| Comparative Example 33 | 1.4 | 100 | 8.72 | Yes | Yes | ≤3 | $3.46 \times 10^3$ |
| Comparative Example 34 | 1.4 | 100 | 10.48 | Yes | Yes | ≤3 | $3.87 \times 10^3$ |
| Comparative Example 35 | 1.4 | 100 | 14.12 | Yes | Yes | ≤3 | $2.47 \times 10^6$ |
| Comparative Example 36 | 1.4 | 100 | 15.27 | Yes | Yes | ≤3 | $3.54 \times 10^6$ |

TABLE 4

|  | Pulling Rate (mm/min) | Processing Time (min) | Oxygen Concentration ($\times 10^{17}$ atoms/cm$^3$) | Was Cooling Device used or not? | Was Pre-annealing performed or not? | Generation of Epitaxial Defects (defects/Wafer) | BMD Density (defects/cm$^2$) |
|---|---|---|---|---|---|---|---|
| Comparative Example 37 | 1.3 | 120 | 10.35 | Yes | No | ≤3 | $1.54 \times 10^3$ |
| Comparative Example 38 | 1.3 | 120 | 13.72 | Yes | No | ≤3 | $8.59 \times 10^3$ |
| Comparative Example 39 | 1.1 | 150 | 10.01 | Yes | No | ≤3 | $2.46 \times 10^3$ |
| Comparative Example 40 | 1.1 | 150 | 13.94 | Yes | No | ≤3 | $7.55 \times 10^3$ |
| Comparative Example 41 | 1.0 | 170 | 10.29 | Yes | No | ≤3 | $1.26 \times 10^3$ |
| Comparative Example 42 | 1.0 | 170 | 13.74 | Yes | No | ≤3 | $6.68 \times 10^3$ |
| Comparative Example 43 | 1.3 | 120 | 8.71 | Yes | No | ≤3 | $1.12 \times 10^3$ |
| Comparative Example 44 | 1.3 | 120 | 15.36 | Yes | No | ≥50 | $8.17 \times 10^3$ |
| Comparative Example 45 | 1.1 | 150 | 8.54 | Yes | No | ≤3 | $1.63 \times 10^3$ |
| Comparative Example 46 | 1.1 | 150 | 15.49 | Yes | No | ≥50 | $7.64 \times 10^3$ |
| Comparative Example 47 | 1.0 | 170 | 8.63 | Yes | No | ≤3 | $1.57 \times 10^3$ |
| Comparative Example 48 | 1.0 | 170 | 15.28 | Yes | No | ≥50 | $8.05 \times 10^3$ |

TABLE 4-continued

|  | Pulling Rate (mm/min) | Processing Time (min) | Oxygen Concentration (×10$^{17}$ atoms/cm$^3$) | Was Cooling Device used or not? | Was Pre-annealing performed or not? | Generation of Epitaxial Defects (defects/Wafer) | BMD Density (defects/cm$^2$) |
|---|---|---|---|---|---|---|---|
| Comparative Example 49 | 1.4 | 100 | 8.73 | Yes | No | ≤3 | 1.81 × 10$^3$ |
| Comparative Example 50 | 1.4 | 100 | 10.54 | Yes | No | ≤3 | 1.88 × 10$^3$ |
| Comparative Example 51 | 1.4 | 100 | 14.37 | Yes | No | ≤3 | 6.57 × 10$^3$ |
| Comparative Example 52 | 1.4 | 100 | 15.54 | Yes | No | ≤3 | 3.28 × 10$^4$ |

(Evaluation 2)

In Tables 3 and 4, the number of epitaxial defects per wafer is an average value of measurements of epitaxial wafers. As apparent from Tables 3 and 4, an average number of epitaxial defects per wafer is as small as 3 or less, and the BMD density is as high as 1×10$^4$ defects/cm$^2$ or more in Examples 7 to 12.

As understood from the above result, an average number of epitaxial defects is increased through pre-annealing on condition that the oxygen concentration is as high as more than 14×10$^{17}$ atoms/cm$^3$ even if a cooling device is provided, so it is preferred to set the upper limit of the oxygen concentration to 14×10$^{17}$ atoms/cm$^3$ or less. The BMD density is less than 1×10$^4$ defects/cm$^2$ with the oxygen concentration of less than 10×10$^{17}$ atoms/cm$^3$. Further, the BMD density is higher with pre-annealing than without pre-annealing. Thus, it is preferred to perform pre-annealing. Further, even if the processing time is within 120 to 180 minutes, the BMD density is lower than 1×10$^4$ defects/cm$^2$ in Comparative Examples 27, 29, and 31. To avoid such a situation, it is preferred to set the lower limit of the oxygen concentration to 10×10$^{17}$ atoms/cm$^3$ or more.

As apparent from the result of comparing Examples 7 to 12 and Comparative Examples 27 to 52, if the cooling device 36 is placed in the chamber 21, a silicon wafer is sliced from the silicon single crystal 12 that is allowed to grow while passed through a temperature region of 800 to 600° C. in 180 to 120 minutes during the pulling step and has an oxygen concentration of 10 to 14×10$^{17}$ atoms/cm$^3$, and the silicon wafer is pre-annealed prior to formation of an epitaxial layer, an epitaxial wafer can be manufactured with a high density of BMDs effective as gettering sites, 1×10$^4$ defects/cm$^2$ or more, and a low density of epitaxial defects, 3 or less per wafer.

Incidentally, as a result of comparing Examples 1 to 6 where the processing time is 250 minutes or less and 180 minutes or more with Examples 7 to 12 where the processing time is less than 180 minutes or 120 minutes or more, an IG effect is not different, and higher productivity is expected in Examples 7 to 12 because of short processing time. Under the condition that the single crystal is passed through a temperature region of 800 to 600° C., a wafer quality equivalent to that of Examples can be attained in Comparative Examples 35, 36, 51, and 52. However, if the crystal is pulled at too high speed, there arises in that crystal axis is cut or cracked and its productivity drops, so the above process is not carried out in 120 minutes or less.

What is claimed is:

1. A method for manufacturing an epitaxial wafer, comprising: pulling a silicon single crystal from a boron-doped silicon melt in a chamber based on a Czochralski process; and forming an epitaxial layer on a surface of a silicon wafer sliced from the silicon single crystal; wherein the silicon single crystal is allowed to grow while passed through a temperature region of 800 to 600° C. in the chamber in 250 minutes or less and 180 minutes or more without a cooling device during the pulling;
   wherein the grown silicon single crystal has an oxygen concentration less than a range of 10×10$^{17}$ to 12×10$^{17}$ atoms/cm$^3$ (ASTMF121-1979) and a resistivity of 0.03 to 0.01 Ωcm; and
   wherein the silicon wafer is subjected to pre-annealing prior to the forming of the epitaxial layer on the surface of the silicon wafer, for 10 minutes to 4 hours at a predetermined temperature within a temperature region of 650 to 900° C. in an inert gas atmosphere, and BMDs generated in the wafer except for the epitaxial layer are at a density of 1×10$^4$/cm$^2$ to 5×10$^6$/cm$^2$.

2. The method of claim 1, wherein a rate of temperature increase from room temperature to the predetermined temperature for pre-annealing is 1 to 8° C./min and a rate of temperature decrease from the predetermined temperature to the room temperature is 5 to 2° C./min.

3. The method of claim 1 wherein the silicon single crystal is pulled at a rate of 0.7 mm/min to 1.1 mm/min.

4. The method of claim 1 wherein the silicon wafer has an oxygen concentration of from 10×10$^{17}$ to 12×10$^{17}$ atoms/cm$^3$ (ASTMF121-1979).

5. The method of claim 4 wherein the silicon wafer has an oxygen content of from 10×10$^{17}$ to 11×10$^{17}$ atoms/cm$^3$ (ASTMF121-1979).

6. The method of claim 1 wherein the silicon temperature at the melt interface is about 1400° C., 800° C. in a lower portion of the chamber and about 600° C. in a portion of the chamber above the lower portion of the chamber.

7. The method of claim 1 wherein during the pulling the single silicon crystal is cooled at a temperature decrease of 0.80 to 1.11° C./min.

8. The method of claim 1 wherein the wafer is pre-annealed by placing it in a resistance heating vertical furnace set at 600 to 700° C. and the temperature is raised at a rate of 4 to 6° C./min and is held at the predetermined temperature for 30 to 60 minutes and is then cooled at a rate of 4 to 3° C. in an inert gas atmosphere selected from the group consisting of nitrogen, argon and mixtures thereof.

9. The method of claim 1 wherein the pre-annealed wafer is polished into a mirror-surface and an epitaxial layer is grown on the mirror surface by placing the wafer in a single-wafer epitaxial device and subjected to hydrogen baking at a temperature of from 1000 to 1150° C. for 1 minute and then exposed to trichlorosilane gas in the device and held at a temperature of 1000 to 1150° C. for 30 to 180 seconds to form a 4 μm-thick epitaxial layer on the wafer surface.

10. A method for manufacturing an epitaxial wafer, comprising:
pulling a silicon single crystal from a boron-doped silicon melt in a chamber through forced cooling based on a Czochralski process; and
forming an epitaxial layer on a surface of a silicon wafer sliced from the silicon single crystal;
wherein the silicon single crystal is allowed to grow while passed through a temperature region of 800 to 600° C. in the chamber in less than 180 minutes and 120 minutes or more during the pulling;
wherein the grown silicon single crystal has an oxygen concentration of $10 \times 10^{17}$ or more and $14 \times 10^{17}$ atoms/cm$^3$ or less (ASTMF121-1979) and a resistivity of 0.03 to 0.01 Ωcm; and
wherein the silicon wafer is subjected to pre-annealing prior to the forming of the epitaxial layer on the surface of the silicon wafer, for 10 minutes to 4 hours at a predetermined temperature within a temperature region of 650 to 900° C. in an inert gas atmosphere, and BMDs generated in the wafer except for the epitaxial layer are at a density of $1 \times 10^4$/cm$^2$ to $5 \times 10^6$/cm$^2$.

11. The method of claim 10, wherein a rate of temperature increase from room temperature to the predetermined temperature for pre-annealing is 1 to 8° C./min and a rate of temperature decrease from the predetermined temperature to the room temperature is 5 to 2° C./min.

12. The method of claim 11 wherein the forced cooling is performed with a water-cooling type cooling device placed in the chamber.

13. The method of claim 10, wherein the forced cooling is performed with a water-cooling type cooling device placed in the chamber.

14. The method of claim 10 wherein the silicon single crystal has a diameter of at least 300 mm.

15. The method of claim 10 wherein the silicon single crystal has a diameter of from 300 to 450 mm.

* * * * *